(12) United States Patent
Chen et al.

(10) Patent No.: US 6,365,966 B1
(45) Date of Patent: Apr. 2, 2002

(54) STACKED CHIP SCALE PACKAGE

(75) Inventors: Jian-Wen Chen; Sung-Fei Wang, both of Kaohsiung (TW)

(73) Assignee: Advanced Semiconductor Engineering, Inc., Kaohsuing (TW)

( * ) Notice: Subject to any disclaimer, the term of this patent is extended or adjusted under 35 U.S.C. 154(b) by 0 days.

(21) Appl. No.: 09/632,677

(22) Filed: Aug. 7, 2000

(51) Int. Cl.[7] .............................................. H01L 23/34
(52) U.S. Cl. ...................................... 257/723; 257/777
(58) Field of Search ................................ 257/723, 777, 257/685, 686

(56) References Cited

U.S. PATENT DOCUMENTS 5,721,452 A * 2/1998 Fogal et al. ................. 257/777
6,133,637 A * 10/2000 Hikita et al. ................. 257/777

* cited by examiner

Primary Examiner—Roy Potter
(74) Attorney, Agent, or Firm—J. C. Patents (57) ABSTRACT

A stacked chip scale package. The stacked chip scale package has a substrate having mounting pads arranged to lie close to the rectangular sides. A smaller silicon chip is stacked on the active surface of a larger silicon chip and the larger silicon chip rest on the substrate. The mounting pads on the substrate are distributed around the periphery of the lower silicon chip. Both the upper silicon chip and the lower silicon chip have only one pair of opposite sides having bonding pads. The pair of edges of the upper silicon chip with bonding pads nearby is parallel to the pair of edges of the lower silicon chip without bonding pads. The bonding pads on the upper chip and the lower chip are electrically connected to their neighboring mounting pads through conductive wires. The conductive wires, the upper silicon chip, the lower silicon chip and a portion of the substrate are enclosed by packaging material.

23 Claims, 5 Drawing Sheets

STACKED CHIP SCALE PACKAGE

BACKGROUND OF THE INVENTION

1. Field of Invention

The present invention relates to a stacked chip scale package. More particularly, the present invention relates to a stacked chip scale package capable of reducing package thickness and preventing any short-circuiting between conductive wires.

2. Description of Related Art

Advances in integrated circuit are made towards a higher level of integration, higher packing density, smaller volume, multi-functions and higher performance. All these improvements befall not just in the fabrication of semiconductor chip, but also in the later stage packaging of semiconductor chips as well. The up-coming trend is towards the fabrication of more multi-function high-performance integrated circuits. For example, a logic chip, a memory controller chip and a graphic accelerator chip are often integrated together in the same package so that a single package can perform multiple functions. In the semiconductor industry, the system-on-chip (SOC) package has been developed. However, bottlenecks in the fabrication of system chips still exist, creating a need for a breakthrough to increase production yield before mass production is feasible. Among the back-stage packaging techniques, multi-chip module (MCM) is the most promising technique for the future.

Figure 1:
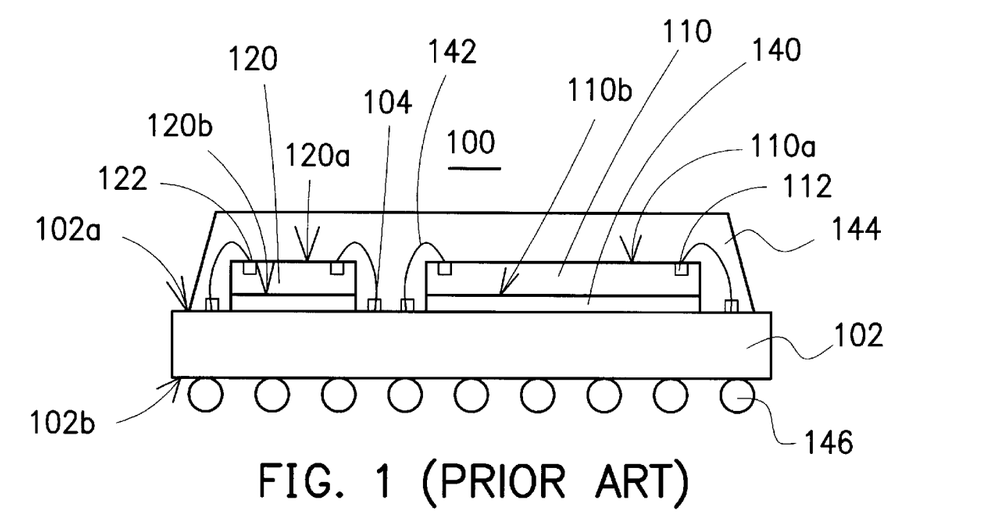
FIG. 1 is a schematic cross-sectional view showing a conventional multi-chip module.
Figure 2:
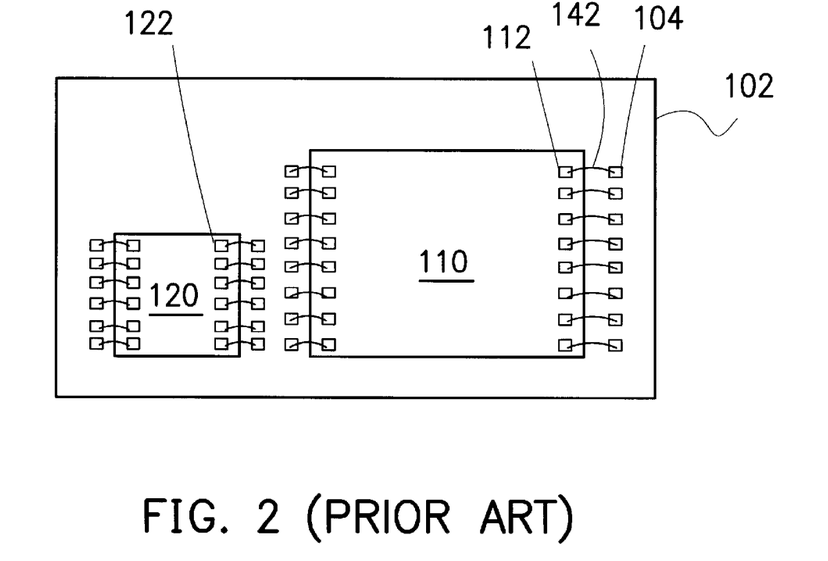
FIG. 2 is a top view of the multi-chip module shown in FIG. 1.

In a multi-chip module, a plurality of silicon chips is sealed within the same package. Compared with various individually packaged chips, a MCM is much better at reducing package volume and shortening signal transmission route between different chips. FIG. 1 is a schematic cross-sectional view showing a conventional multi-chip module. FIG. 2 is a top view of the multi-chip module shown in FIG. 1. As shown in FIGS. 1 and 2, a conventional multi-chip module 100 is built atop a laminated board 102. Laminated board 102 consists of a plurality of patterned wiring layers and insulation layers (not shown) alternating with each other. The upper surface 102a of laminated board 102 includes a plurality of mounting pads or gold fingers 104. The backsides 110b and 120b of chips 110 and 120 are attached to the upper surface 102a of laminated board 102 with an adhesive material 140. The active surface 110a of chip 110 has a plurality of bonding pads 112 and the active surface 120a of chip 120 has a plurality of bonding pads 122. The bonding pads 112 and 122 serve as contact nodes for external devices. Gold wires 142 are used to connect bonding pads 112 and 122 with mounting pads 104. A molding compound 144 encloses the gold wires 142, the chips (110 and 120) and a portion of the laminated layer 102. A plurality of solder balls 146 is attached to the underside 102b of laminated board 102, thereby forming a ball grid array (BGA). Solder balls 146 connect with mounting pads using patterned wiring layers and serve as external contact nodes for multi-chip module 100. The solder balls of the multi-chip module can be soldered onto a printed circuit board using surface mount technologies.

Figure 3:
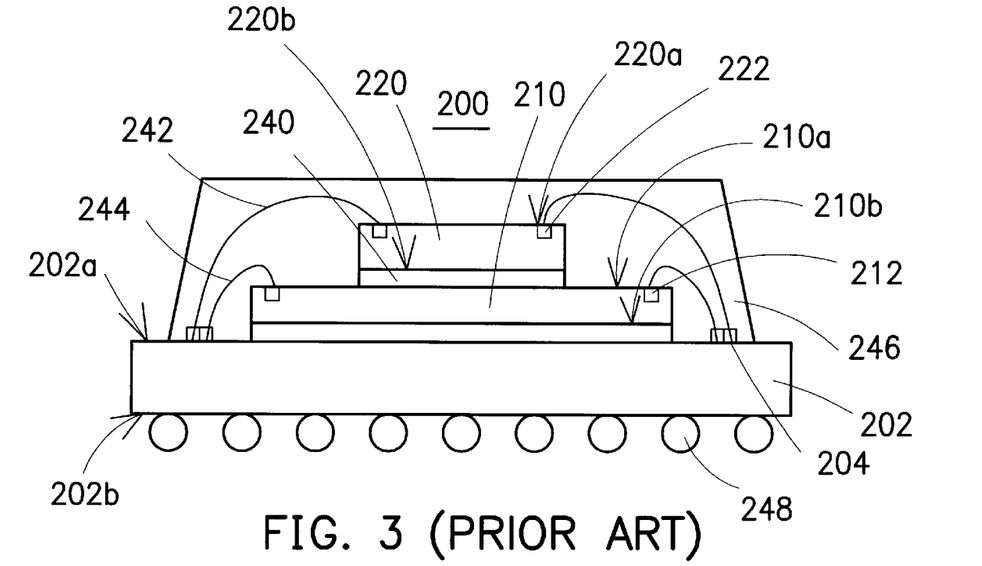
FIG. 3 is a schematic cross-sectional side view of a conventional stacked chip scale package.

The aforementioned multi-chip module employs a side-by-side layout design. Hence, area occupation is somewhat larger and packing density is somewhat lower than in a chip scale package (CSP). FIG. 3 is a schematic cross-sectional side view of a conventional stacked chip scale package. As shown in FIG. 3, a conventional stacked chip scale package (SCSP) 200 is built atop a laminated board 202. A plurality of mounting pads 204 is formed on the upper surface 202a of laminated board 202. The backside 210b of a silicon chip 210 is attached to the upper surface 202a of laminated board 202 with an adhesive material 240. The backside 220b of a silicon chip 220 is attached to the active surface 210a of chip 210 with the adhesive material 240, thereby forming a stacked structure. The active surfaces 210a of chip 210 has a plurality of bonding pads 212 and the active surface 220a of silicon chip 220 has a plurality of bonding pads 222. The bonding pads 212 and 222 serve as contact nodes for external devices. Gold wires 242 and 244 are used to connect mounting pads 204 with bonding pads 220 and 210 respectively. A molding compound 246 encloses the gold wires (242 and 244), the chips (210 and 220) and a portion of the laminated layer 202. A plurality of solder balls 248 is attached to the underside 202b of laminated board 202, thereby forming a ball grid array (BGA). Solder balls 248 connect with mounting pads is 204 using patterned wiring layers and serve as external contact nodes for stacked chip scale package 200. The solder balls of the chip scale package can be soldered onto a printed circuit board using surface mount technologies. Although the chip scale package can reduce area occupation and considerably increase packing density, arching gold wires 242 and 244 above silicon chips 210 often lead to short-circuiting.

SUMMARY OF THE INVENTION

The present invention provides a stacked chip scale package capable of preventing the short-circuiting of connection wires going to two separate silicon chips inside the package so that production yield is increased.

The invention further provides a stacked chip scale package capable of reducing overall package thickness.

To achieve these and other advantages and in accordance with the purpose of the invention, as embodied and broadly described herein, the invention provides a stacked chip scale package. The stacked chip scale package uses a substrate having mounting pads thereon. The mounting pads are arranged to lie close to the rectangular sides. A lower and an upper chip are stacked on top each other above the substrate. The chip sitting directly on top of the substrate has a larger size. The upper chip rests on the active surface of the lower chip. The mounting pads on the substrate are distributed around the periphery of the lower silicon chip. Both the upper chip and the lower chip have only one pair of opposite sides having bonding pads. The pair of opposite edges of the upper silicon chip having bonding pads is parallel to the pair of opposite edges of the lower silicon chip without bonding pads. The bonding pads on the upper chip and the lower chip are electrically connected to their neighboring mounting pads using conductive wires. Molding compound encloses the conductive wires, the upper silicon chip, the lower chip and a portion of the substrate.

According to one embodiment of this invention, distance between the bonding pads of the lower chip and neighboring mounting pad is about 15–30 mils. The difference in distance between separation of bonding pads on opposite edges of the upper chip and separation of bonding pads on the opposite edges of the lower chip is greater than 200 mils. In addition, the bonding pads on the upper chip and the mount pad are wire bonded together using a reverse bonding method so that overall thickness of the package can be further reduced.

In this invention, the pair of opposite sides with bonding pads on the upper chip is orthogonal to the pair of opposite sides with bonding pads on the lower chip. The mounting pads corresponding to the bonding pads are formed on four sides of the substrate. Furthermore, for a stacked structure having an upper silicon chip much smaller than the lower silicon chip, orthogonal distribution of bonding pads on opposite sides can prevent the short-circuiting of conductive wire leading from bonding pads. Moreover, the stacked structure of this invention can reduce length of bonding wires, thereby lowering arc height of bonding wires and hence overall package thickness.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4:
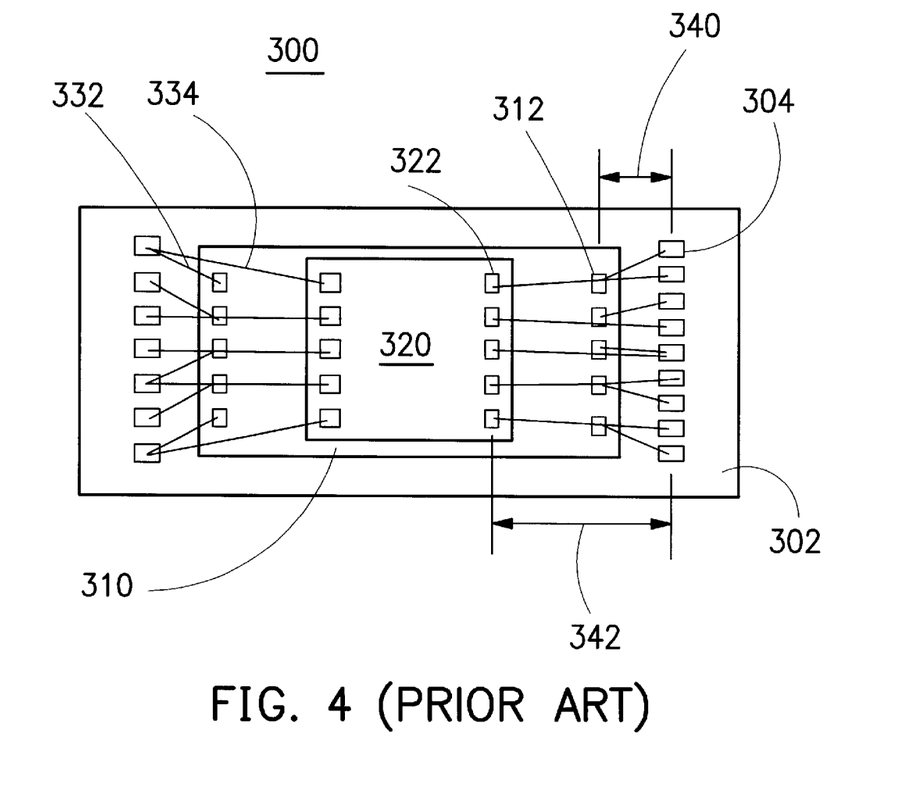
FIG. 4 is a schematic top view of a conventional stacked package structure.
Figure 5:
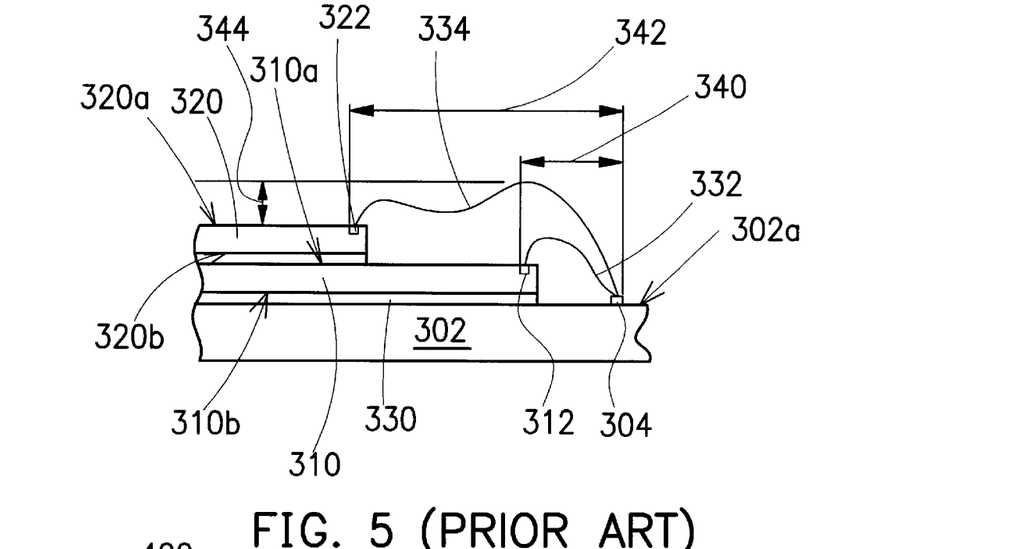
FIG. 5 is the cross-sectional side view showing the wire bonding section of the stacked package structure shown in FIG. 4.

FIG. 4 is a schematic top view of a conventional stacked package structure. FIG. 5 is the cross-sectional side view showing the wire bonding section of the stacked package structure shown in FIG. 4. At present, the bonding pads of most semiconductor chips are positioned along one of the pairs of opposite sides. Examples of such an arrangement include flash memory chip and static random access memory (SRAM). To form a stacked chip scale package using this type of semiconductor chip, many design considerations have to be considered. As shown in FIG. 4 and 5, the stacked chip scale package 300 is built atop a substrate 302 such as a laminated board. The laminated board consists of a plurality of insulation layer and patterned wiring layer stacked alternately on top of each other. The insulation layers are formed from material such as glass epoxy resins (FR-4 or FR-5), bismaleimide-triazine (BT) or epoxy resins. The patterned wiring layers are copper foil layers patterned via a photolithographic process. The upper surface 302a of the substrate 302 has a plurality of mounting pads 304 serving as contact nodes for chips. The backside 310b of a lower chip 310 is glued onto the upper surface 302a of substrate 302 with an adhesive material 330 such as silver paste. The backside 320b of an upper chip 320 is glued to the active surface 310a of lower chip 310 with the adhesive material 330.

The bonding pads 312 on the active surface 310a of the lower chip 310 are electrically connected to mounting pads 304 by conductive wires 332 such as gold or aluminum wires. The bonding pads 322 on the active surface 320a of the upper chip 320 are electrically connected to the mounting pads 304 by conductive wires 334. However, the following points must be considered:

1. Distances 340 of separation between the bonding pads 312 on the lower chip 310 and the mounting pads 304 are directly related to size of the package. To reduce package size to the requirement of a chip scale package (referring to the stipulation that the chips should occupy 80%–90% of package area), distance 340 is usually controlled to within 30 mils. For convenience of wire bonding, the distance 340 must be greater than about 15 mils.

2. Distance 342 of separation between the bonding pads 322 on the upper chip 320 is a major consideration regarding the package. Another consideration is the arc height 344 or vertical distance from the bonding pads 322 to the peak of the conductive wires 334. In general, the upper package 320 is normally placed near the central region of the lower chip 310. Therefore, distance 342 is largely determined by the difference in dimensions between the upper chip 320 and the lower chip 310 as well as the distance between the bonding pads 312 of lower chip 310 and the mounting pads 304. Arc height 342 is closely related to thickness of the package. To reduce package size and meet standard package thickness requirement, arc height 344 is typically controlled within 6 mils.

However, when the upper chip 320 and the lower chip 310 have considerable difference in dimensions, the said stacked structure may result in various problems. For example, when distance 340 is controlled to within 30 mils while distance 342 is greater than 130 mils, in other words, when the difference in distance between the bonding pad pairs 312 and 322 of the lower chip 310 and the upper chip 320 is greater than 200 mils and arc height 344 is within 6 mils, wire bonding of the upper chip 320 is very difficult. Conductive wires 332 will have a high arc height because of closeness between the mounting pads 304 and the edges of the lower chip 310. An exceptionally long conductive wire 334 (distance 342 is greater than 130 mils) and limitation of arc height 344 (under 6 mils) leads to greater difficulties in wire bonding. Moreover, sweeping and short-circuiting of conductive wires 334 are more likely to occur during package molding. To resolve the problems, distance 340 must be increased and arc height 344 must be relaxed. Yet, these strategies are detrimental to package size reduction. Furthermore, increasing distance 340 is likely to result in other more serious problems including high wiring resistance.

Figure 6:
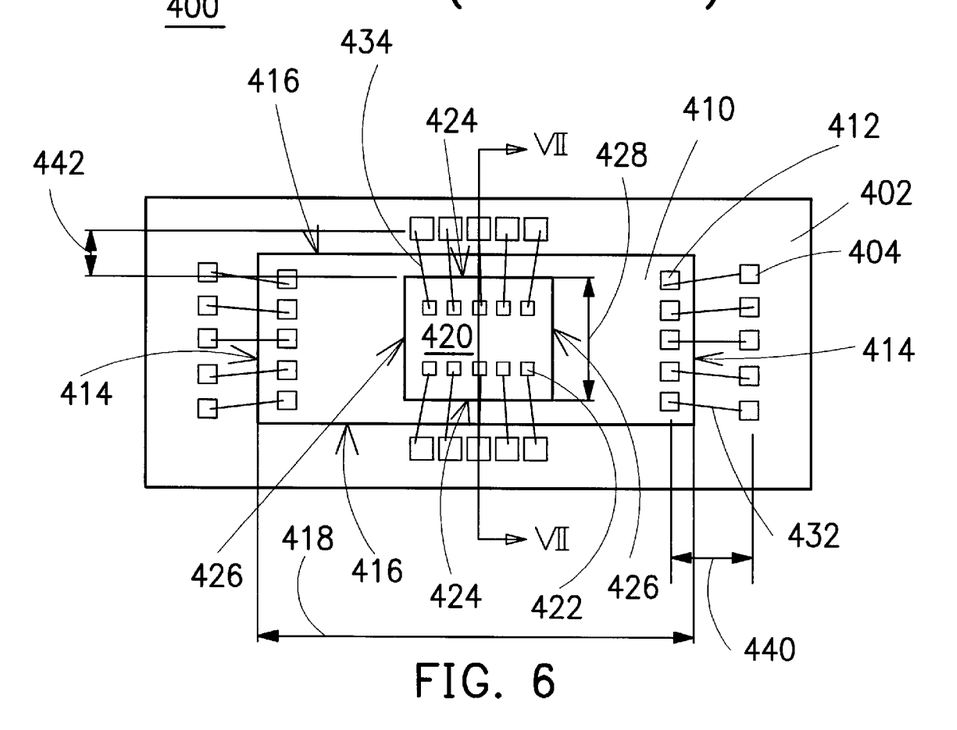
FIG. 6 is a schematic top view of a stacked chip scale package according to a first preferred embodiment of this invention.
Figure 7:
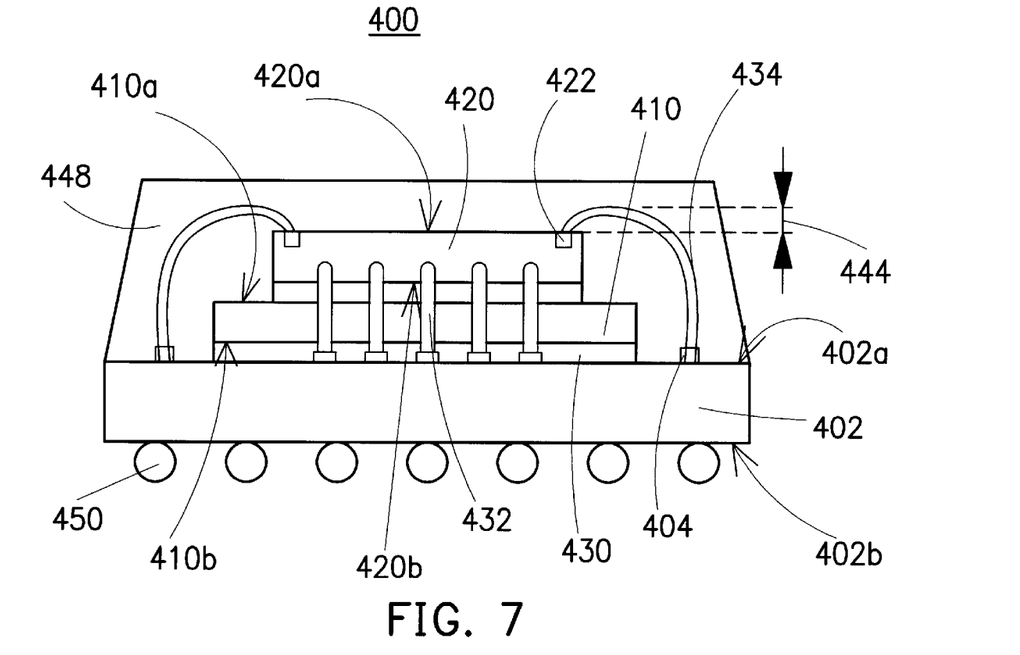
FIG. 7 is a cross-sectional view along line VII—VII of FIG. 6 showing the outline of bonding wires formed by a normal wire bonding method.

FIG. 6 is a schematic top view of a stacked chip scale package according to a first preferred embodiment of this invention. FIG. 7 is a cross-sectional view along line VII—VII of FIG. 6 showing the outline of bonding wires formed by a normal wire bonding method. As shown in FIGS. 6 and 7, the stacked chip scale package 400 is built atop a substrate 402 such as a laminated board. The laminated board consists of a plurality of insulation layer and patterned wiring layer stacked alternately on top of each other. The insulation layers are formed from material such as glass epoxy resins (FR-4 or FR-5), bismaleimide-triazine (BT) or epoxy resins. The patterned wiring layers are copper foil layers patterned via a photolithographic process. The upper surface 402a of substrate 402 has a plurality of mounting pads 404 arranged to lie next to all four sides of the board. Mounting pads 404 serves as contact nodes for chips.

In this invention, the bonding pads 412 of a lower chip 410 are positioned on a pair of opposite sides. Similarly, the bonding pads 422 of an upper chip 420 are also positioned on a pair of opposite sides. Lower chip 410 includes a pair of sides (shorter edges) 414 having bonding pads 412 nearby and a pair of sides (longer edges) 416 without any bonding pads nearby. Bonding pads 412 are formed next to the pair of sides 414. Similarly, upper silicon chip 420 also includes a pair of sides 424 having bonding pads 422 nearby and a pair of sides 426 without any bonding pads nearby. The backside 410b of the lower chip 410 is attached to the upper surface 402a of substrate 402 with adhesive material 430 such as silver paste. The mounting pads 404 on substrate 402 surround the edges of the lower chip 410. The backside 420b of the upper chip 420 is attached to the active surface 410a of the lower chip 410 with the adhesive material 430. The upper chip 420 is oriented in such a way that the pair of opposite sides 424 is parallel to the pair of opposite sides 416 of the lower chip 410. Furthermore, the entire area of the upper chip 420 is within the area of the lower chip 410.

Bonding pads 412 on the active surface 410a of the lower chip 410 are electrically connected to the mounting pads 404 next to neighboring sides 414 using conductive wires 432 such as gold or aluminum wires. Similarly, bonding pads 422 on the active surface 420a of the upper chip 420 are electrically connected to the mounting pads 404 next to neighboring sides 416 (corresponding to sides 424 of upper silicon chip 420) using conductive wires 434. According to this invention, the pair of opposite sides 414 of the lower chip 410 and the pair of opposite sides 424 of the upper chip 420 are orthogonal to each other. Bonding pads 422 of the upper chip 420 are electrically connected to neighboring mounting pads 404 instead of the mounting pads 404 on sides 414. Hence, distance from the mounting pads 404 to the bonding pads 422 is reduced and interference between conductive wires are minimized considerably. Furthermore, wire-bonding can be conducted with ease even for a stacked structure whose difference between distance 428 of upper silicon chip 420 and distance 418 of the lower chip 410 is greater than 200 mils.

In addition, this type of mounting pad arrangement is able to control the distance 440 from bonding pads 412 of the lower chip 410 to their corresponding mounting pads 404 to be less than about 30 mils. Even the distance 442 from bonding pads 422 of the upper chip 420 to their corresponding mounting pads 404 can be controlled to be less than about 30 mils. Hence, this invention can effectively control the dimensions of a package so that the requirements of a chip scale package are met. Furthermore, due to a reduction in distance between bonding pads 422 of the upper chip 420 and their corresponding mounting pads 404, arc height 444 can be easily controlled to within about 6 mils. Thus, thickness of package is reduced and wire interference is minimized. Moreover, sweeping of wires during molding is prevented, thereby increasing product yield.

Molding compound 448 encloses conductive wires (432 and 434), silicon chips (410 and 420) and a portion of substrate 402. A plurality of solder balls 450 is attached to the underside 402b of substrate 402, forming a ball grid array. Solder balls 450 are electrically connected to mounting pads 404 through patterned wiring layers. Solder balls 450 serve as external contact nodes of multi-chip package 400 with a printed circuit board, for example.

Figure 8:
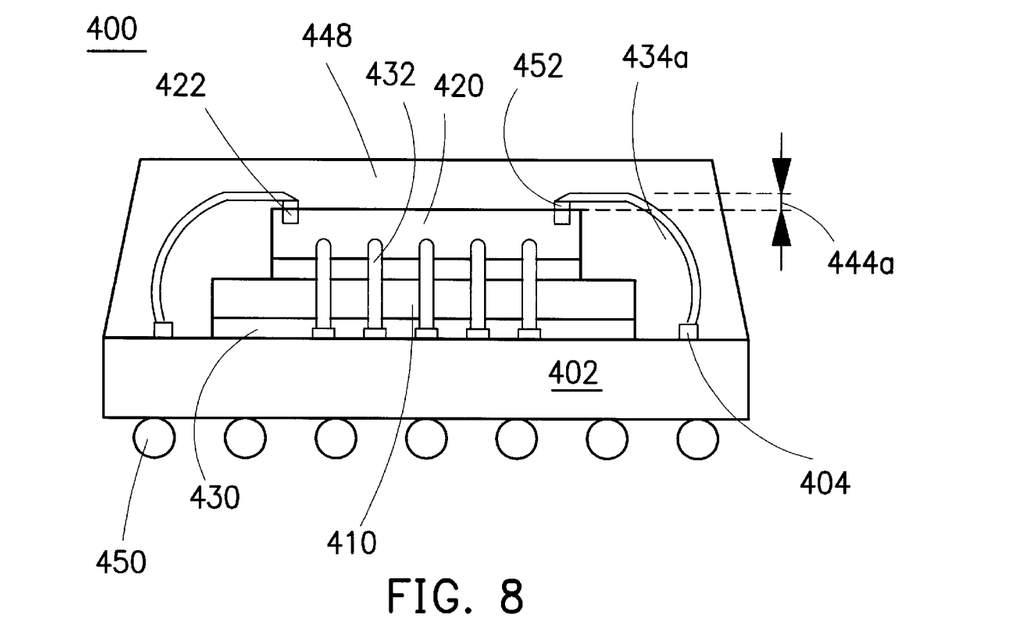
FIG. 8 is a cross-sectional view along line VII—VII of FIG. 6 showing the outlines of bonding wires formed by a reverse bonding method.

Since this invention is able to reduce interference between conductive wires to the upper chip and the lower chip and wiring distance to the upper chip, a reverse bonding method can be used. FIG. 8 is a cross-sectional view along line VII—VII of FIG. 6 showing the outlines of bonding wires formed by a reverse bonding method. Reverse bonding method is explained in great detail in U.S. Pat. Nos. 5,328, 079 and 5,735,030. As shown in FIG. 8, conductive bumps 452 are first formed on the bonding pads 422 of upper silicon chip 420. One end of a bonding wire 434a bonds to the contact node of a particular mounting pad 404 and the other end of bonding wire 434a bonds to a corresponding conductive bump 452. Using this type of bonding method, arc height 444a can be controlled to within about 2 mils leading to a further reduction of package thickness.

Figure 9:
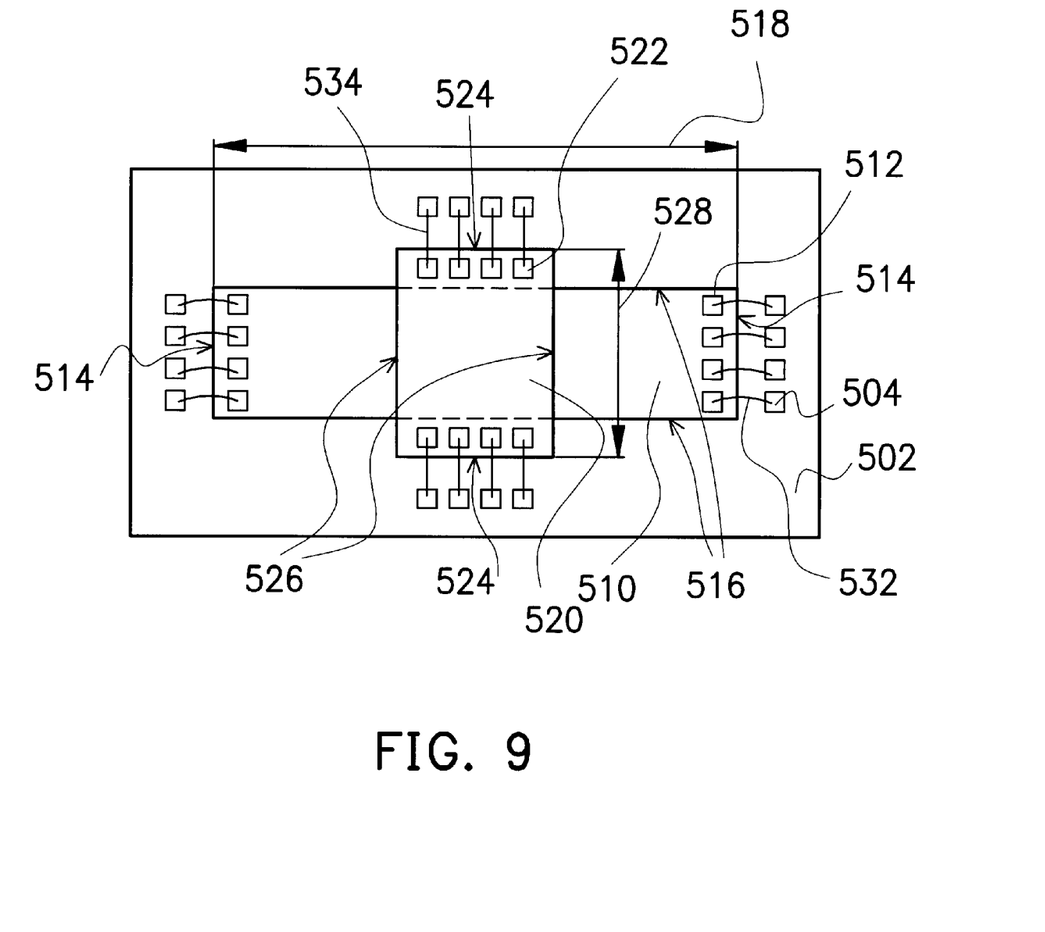
FIG. 9 is a schematic top view showing a stacked chip scale package according to a second preferred embodiment of this invention.

FIG. 9 is a schematic top view showing a stacked chip scale package according to a second preferred embodiment of this invention. For the stacked chip scale package shown in FIG. 9, bonding pads are found only on a pair of opposite sides of upper chip 520 and lower chip 510. In other words, lower chip 510 includes a pair of sides 514 having bonding pads nearby and a pair of empty sides 516 without any bonding pads nearby. Upper chip 520 includes a pair of opposite sides 524 having bonding pads nearby and a pair of empty opposite sides 526 without any bonding pads nearby. If the difference between distance 518 of the lower chip 510 and distance 528 of the upper chip 520 is greater than 200 mils, upper chip 520 and lower chip 510 are oriented orthogonal to each other. In other words, the pair of sides 514 belonging to lower chip 510 (with bonding pads nearby) and the pair of sides 524 (with bonding pads nearby) belonging to upper chip 520 are perpendicular to each other. Similarly, the mounting pads 504 on substrate 502 are arranged to lie close to four sides corresponding to the positions of bonding pads 522 and 512 of chips 520 and 510. Consequently, interference between conductive wires 532 and 534, distance between bonding pads and corresponding mounting pads and thickness of package are all reduced, thereby meeting the minimum requirements of a chip scale package. Furthermore, a reverse wire bonding method can be used, leading to a further reduction of package thickness.

In summary, the advantages of this invention at least include:

1. Since only a pair of opposite sides of each chip contains bonding pads and the bonding pads on separate chips are orthogonal to each other, interference or short-circuiting of conductive wires is prevented.

2. The stacked chip scale package of this invention has two chips whose distance of separation between the bonding pads on the chips and the mounting pads of a substrate is limited to values below about 30 mils. Hence, standard requirements of a chip scale package are met. Since interference and short-circuiting due to the use of long conductive wires is no longer a problem, arc height can be lowered. Therefore, a reverse bonding method can be applied to reduce overall thickness of a package even further.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked chip scale package, comprising:
a substrate having a first surface and a second surface, wherein the first surface has a plurality of mounting pads positioned along lines close to the four edges of the substrate;
a first chip having a pair of long sides and a pair of short sides, wherein the first chip includes a first active surface and a first backside, the first backside of the first chip is attached to the first surface of the substrate so that the mounting pads are located close to the edges of the first chip, and the first active surface includes a plurality of first bonding pads formed close to the pair of short sides;
a second chip, wherein both the length and the width of the second chip are smaller than the dimension of the pair of short sides of the first chip, the second chip has a pair of sides having bonding pads nearby and a pair of sides free from bonding pads, the second chip also includes a second active surface and a second backside, the second backside of the chip is attached to the first active surface of the first chip such that the pair of sides having bonding pads nearby is parallel to the pair of long sides of the first chip, and the second active surface includes a plurality of second bonding pads formed close to the pair of sides having bonding pads nearby;
a plurality of conductive wires electrically connecting the first bonding pads and corresponding mounting pads next to the pair of short sides and a plurality of conductive wires electrically connecting the second bonding pads and corresponding mounting pads next to the pair of long sides; and
a molding compound enclosing the first chip on the first surface, the second chip, the mounting pads and the conductive wires.

2. The package of claim 1, wherein a distance from the first bonding pad to a corresponding mounting pad next to the short side is controlled to be between about 15 mils and 30 mils.

3. The package of claim 1, wherein a distance from the second bonding pad to a corresponding mounting pad next to the long side is controlled to be between about 15 mils and 30 mils.

4. The package of claim 1, wherein a difference in distance between the separation of bonding pads on opposite edges of the second silicon chip and the separation of bonding pads on the opposite edges of the first silicon chip is greater than about 200 mils.

5. The package of claim 1, wherein a vertical distance from a peak of a conductive wire attached to the second bonding pad to the bonding pad itself is between about 2 mils and 6 mils.

6. The package of claim 1, wherein the conductive wires joining the second bonding pads and corresponding mounting pads are laid by reverse wire bonding.

7. The package of claim 1, wherein the package further includes a plurality of solder balls attached to the second surface of the substrate and electrically connected to the respective mounting pads.

8. The package of claim 1, wherein the substrate includes a laminated board.

9. The package of claim 1, wherein the conductive wires include gold wires.

10. The package of claim 1, wherein the conductive wires include aluminum wires.

11. A stacked chip scale package, comprising:
a substrate having a first surface and a second surface, wherein the first surface has a plurality of mounting pads distributed along lines close to four edges of the board;
a first chip having a pair of first pad sides and a pair of first empty sides, wherein the first chip includes a first active surface and a first backside, the first backside of the chip is attached to the first surface of the substrate so that the mounting pads surrounds the edges of the first chip, and the first active surface has a plurality of first bonding pads located close to the pair of first pad sides;
a second chip having a pair of second pad sides and a pair of second empty sides, wherein the second chip has a second active surface and a second backside, the second backside of the second chip is attached to the first active surface of the first silicon chip so that the second pad contact sides and the first empty sides are parallel to each other, area of the second chip is entirely enclosed within the region of the first chip, and the second active surface includes a plurality of second bonding pads formed close to the second node contact sides;
a plurality of conductive wires electrically connecting the first bonding pads and their corresponding mounting pads next to the first node contact sides and a plurality of conductive wires electrically connecting the second bonding pad and corresponding mounting pads next to the first empty sides; and
a molding compound enclosing the first chip on the first surface of the substrate, the second chip, the mounting pads and the conductive wires.

12. The package of claim 11, wherein a distance from the first bonding pad to a corresponding mounting pad next to the first node contact side is controlled to between about 15 mils and 30 mils.

13. The package of claim 11, wherein a distance from the second bonding pad to a corresponding mounting pad next to the first empty side is controlled to between about 15 mils and 30 mils.

14. The package of claim 11, wherein a vertical distance from a peak of a conductive wire attached to the second bonding pad to the second bonding pad itself is between about 2 mils and 6 mils.

15. The package of claim 11, wherein the conductive wires joining the second bonding pads and corresponding mounting pads are laid by reverse wire bonding.

16. The package of claim 11, wherein the package further includes a plurality of solder balls attached to the second surface of the substrate electrically connected to the respective mounting pads.

17. The package of claim 11, wherein the substrate includes a laminated board.

18. The package of claim 11, wherein the conductive wires include gold wires.

19. The package of claim 11, wherein the conductive wires include aluminum wires.

20. A stacked chip scale package, comprising:
a substrate having a first surface and a second surface, wherein the first surface has a plurality of mounting pads distributed along lines close to four edges of the board;

a first chip having a pair of first pad sides and a pair of first empty sides, wherein the first chip includes a first active surface and a first backside, the first backside of the chip is attached to the first surface of the substrate so that the mounting pads surround the edges of the first silicon chip, and the first active surface has a plurality of first bonding pads located close to the pair of first pad sides;

a silicon chip having a pair of second pad sides and a pair of second empty sides, wherein the second chip has a second active surface and a second backside, the second backside of the second chip is attached to the first active surface of the first chip so that the second node contact sides and the first empty sides are parallel to each other, the second active surface has a plurality of second bonding pads located close to the second pad sides, and a difference in distance between a separation of the first pad sides and a separation of the second pad sides is greater than about 200 mils;

a plurality of conductive bumps are first formed on the second bonding pads of the second chip;

a plurality of wires electrically connecting the first bonding pads and their corresponding mounting pads next to the first node contact sides, a plurality of conductive wires electrically connecting the conductive bumps of the second bonding pads to the corresponding mounting pads of the substrate by a reverse wire bonding method; and a molding compound enclosing the first chip on the first surface of the substrate, the second chip, the mounting pads and the conductive wires.

21. The package of claim 20, wherein a distance from the first bonding pad to a corresponding mounting pad next to the first node contact side is controlled to between about 15 mils and 30 mils.

22. The package of claim 20, wherein a distance from the second bonding pad to a corresponding mounting pad next to the first empty side is controlled to between about 15 mils and 30 mils.

23. The package of claim 20, wherein a vertical distance from a peak of a conductive wire attached to the second bonding pad to the second bonding pad itself is between about 2 mils and 6 mils.

* * * * *